United States Patent [19]
El-Kareh et al.

[11] Patent Number: 6,057,188
[45] Date of Patent: May 2, 2000

[54] TRENCH CAPACITOR STRUCTURES

[75] Inventors: Badih El-Kareh, Austin, Tex.; Richard Leo Kleinhenz, Wappingers Falls; Stanley Everett Schuster, Granite Springs, both of N.Y.

[73] Assignee: International Business Machines Corporation, Armonk, N.Y.

[21] Appl. No.: 09/019,119

[22] Filed: Feb. 5, 1998

Related U.S. Application Data

[62] Division of application No. 08/846,603, Apr. 30, 1997, Pat. No. 5,805,494.

[51] Int. Cl.$^7$ .............................................. H01L 21/8242
[52] U.S. Cl. ...................... 438/243; 438/386; 438/389; 438/394
[58] Field of Search ................... 438/243, 247, 438/249, 386, 389; 365/149; 257/73, 621

[56] References Cited

U.S. PATENT DOCUMENTS

| | | | |
|---|---|---|---|
| 5,182,224 | 1/1993 | Kim et al. | 438/243 |
| 5,395,783 | 3/1995 | Baumann et al. | 438/243 |
| 5,427,972 | 6/1995 | Shimizu et al. | 438/243 |
| 5,598,367 | 1/1997 | Noble | 365/149 |
| 5,677,225 | 10/1997 | Park | 438/243 |

*Primary Examiner*—Wael Fahmy
*Assistant Examiner*—William David Coleman
*Attorney, Agent, or Firm*—Whitham, Curtis & Whitham; Robert P. Tassinari, Jr.

[57] ABSTRACT

An optimized trench capacitor structure which is useful as a decoupling capacitor or a storage capacitor can be manufactured without added process complexity. As an on-chip decoupling trench capacitor structure, the structure reduces the series resistance to outer and inner plates and results in an acceptable RC delay, while maintaining a high capacitance per unit area. As a storage capacitor with a buried shield, the trench capacitor structure exhibits high immunity to alpha particle and cosmic radiation induced failures. The trench capacitor structure which includes a buried n-well in a silicon substrate. A trench is formed in the substrate and extends through the buried n-well. A dielectric film is formed on an inner surface of the trench, and an inner plate formed as a polysilicon fill within the trench is connected to a surface n+ film formed during definition of peripheral source/drain contacts of the integrated circuit. An outer plate of the capacitor in the form of an out diffusion from the trench provides a low resistance electrical contact with the substrate. A number of these capacitors can be combined in a very efficient X-Y array of decoupling capacitors.

3 Claims, 12 Drawing Sheets

TRENCH CAPACITOR STRUCTURES

RELATED APPLICATIONS

This application is a divisional of U.S. patent application Ser. No. 08/846,603, filed on Apr. 30, 1997 now U.S. Pat. No. 5,805,494.

BACKGROUND OF THE INVENTION

1. Field of the Invention

The present invention generally relates to on-chip trench capacitor structures and, more particularly, to trench capacitor structures which optimize capacitors for diverse applications without added process complexity. The trench capacitor structures have particular application as decoupling capacitors and as node capacitors that enhance the soft-error immunity in, for example, static random access memory (SRAM) cells.

2. Background Description

One of the attributes of a decoupling capacitor is that it should exhibit a time response comparable to that of typical circuits, ranging from 250–300 picoseconds (ps). Present trench decoupling capacitors suffer, however from long resistor-capacitor (RC) delays (in the range of nanoseconds (ns)). Thus, there is a need for a decoupling capacitor structure which has a high capacitance per unit area yet has a time constant comparable to typical circuit switching time constants.

Dense static random access memory (SRAM) cells resulting from advances in lithography and other technology enhancements are reaching the point where the amount of stored charge is not sufficient to prevent high rates of fails from alpha particles and cosmic rays. Thus, there is also a need for capacitor structures that can be connected to the nodes of SRAM cells to enhance the cell immunity to ionizing radiation without increasing cell size.

In both applications, a trench capacitor is desirable in integrated circuits (ICs). However, current trench capacitor structure designs are not optimized for use as either decoupling capacitors or a storage capacitors for use in SRAM cells to attain immunity to soft errors.

SUMMARY OF THE INVENTION

It is therefore an object of the present invention to provide an optimized trench capacitor structure useful as a decoupling capacitor or a storage capacitor without added process complexity.

It is another object of the invention to provide an on-chip decoupling trench capacitor structure which reduces the series resistance to outer and inner plates and results in an acceptable RC delay, while maintaining a high capacitance per unit area.

It is a further object of the invention to provide a trench capacitor structure with a buried shield that exhibits high immunity to alpha particle and cosmic radiation induced failures.

According to the invention, there is provided a trench capacitor structure which includes a buried n-well in a silicon substrate. A trench is formed in the substrate and extends through the buried n-well. A dielectric film is formed on an inner surface of the trench, and an inner plate formed as a polysilicon fill within the trench is connected to a surface n+ film formed during definition of peripheral source/drain contacts of the integrated circuit. An outer plate of the capacitor is formed by combining heavily doped out diffusions from trenches and the buried n-well to provide a low resistance electrical path to the plate. The connection to the plate is made by the combination of top n+ diffusion, top n-well, buried n-well, and n+ out diffusion from the trench. A number of these capacitors can be combined in a very efficient X-Y array of decoupling capacitors.

According to another aspect of the invention, a combination of high capacitance and a buried shield are utilized to minimize the voltage disturbance caused by alpha particles and cosmic rays on the cross-coupled latch nodes of a static random access memory (SRAM) device. A trench is used to achieve the high capacitance with a minimal or zero impact on cell density. The fabrication steps are the same as those used for a standard dynamic random access memory (DRAM) trench cell.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
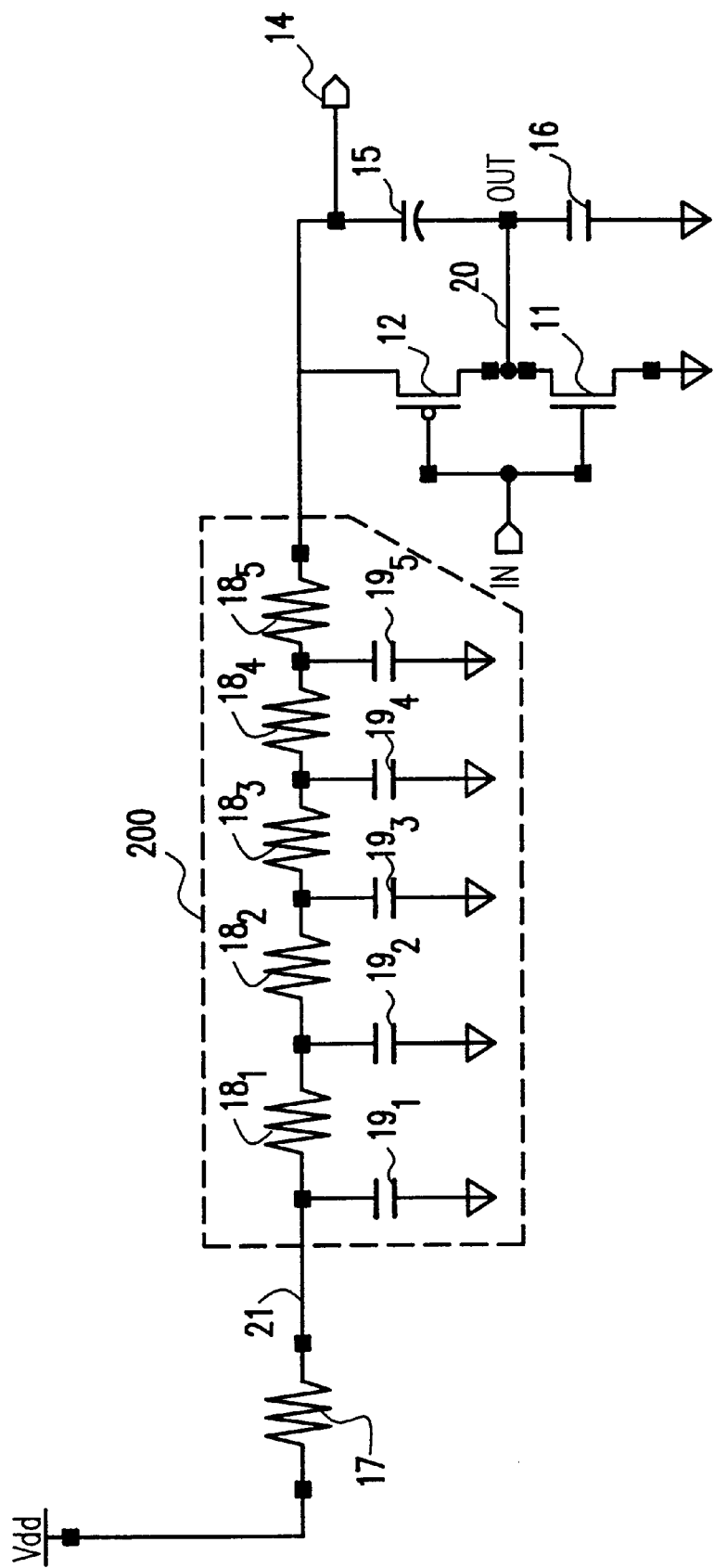
FIG. 1 is a schematic diagram of an inverter with a power supply connection comprising a series of voltage dropping resistors and associated decoupling capacitors.

Referring now to the drawings, and more particularly to FIG. 1, there is shown an electrical model of a decoupling capacitor and an inverter circuit implemented in complementary metal oxide semiconductor (CMOS) technology. This combination of inverter circuit, consisting of an n-channel transistor 11 and a p-channel transistor 12, and decoupling capacitor 200 makes it possible to determine the drop in power supply voltage as the inverter switches for various decoupling capacitor time constants.

The decoupling capacitor 200 consists of capacitor segments $19_1$ to $19_5$ and resistor segments $18_1$ to $18_5$ in order. The combination of resistor and capacitor values determines the time constant of the decoupling capacitor. To show the effect of the time constant of the decoupling capacitor on the drop in power supply voltage for a fixed value of decoupling capacitance, only the resistor segments $18_1$ to $18_5$ are varied. Before the inverter switches, the decoupling capacitor segments $19_1$ to $19_5$ are charged to Vdd through resistor 17. Resistor 17, which is in series with the decoupling capacitor and the inverter, is chosen to have a large enough value that it essentially acts as an open circuit during the time the inverter switches.

The inverter has its output node 20 connected to a capacitor load consisting of capacitor 16, which is connected to ground, and capacitor 15, which is connected to the inverter power supply node 14. The power supply node 14 is connected to one side of the decoupling capacitor 200. The other side of the decoupling capacitor is connected to node 21 which is connected to Vdd through resistor 17.

Figure 2:
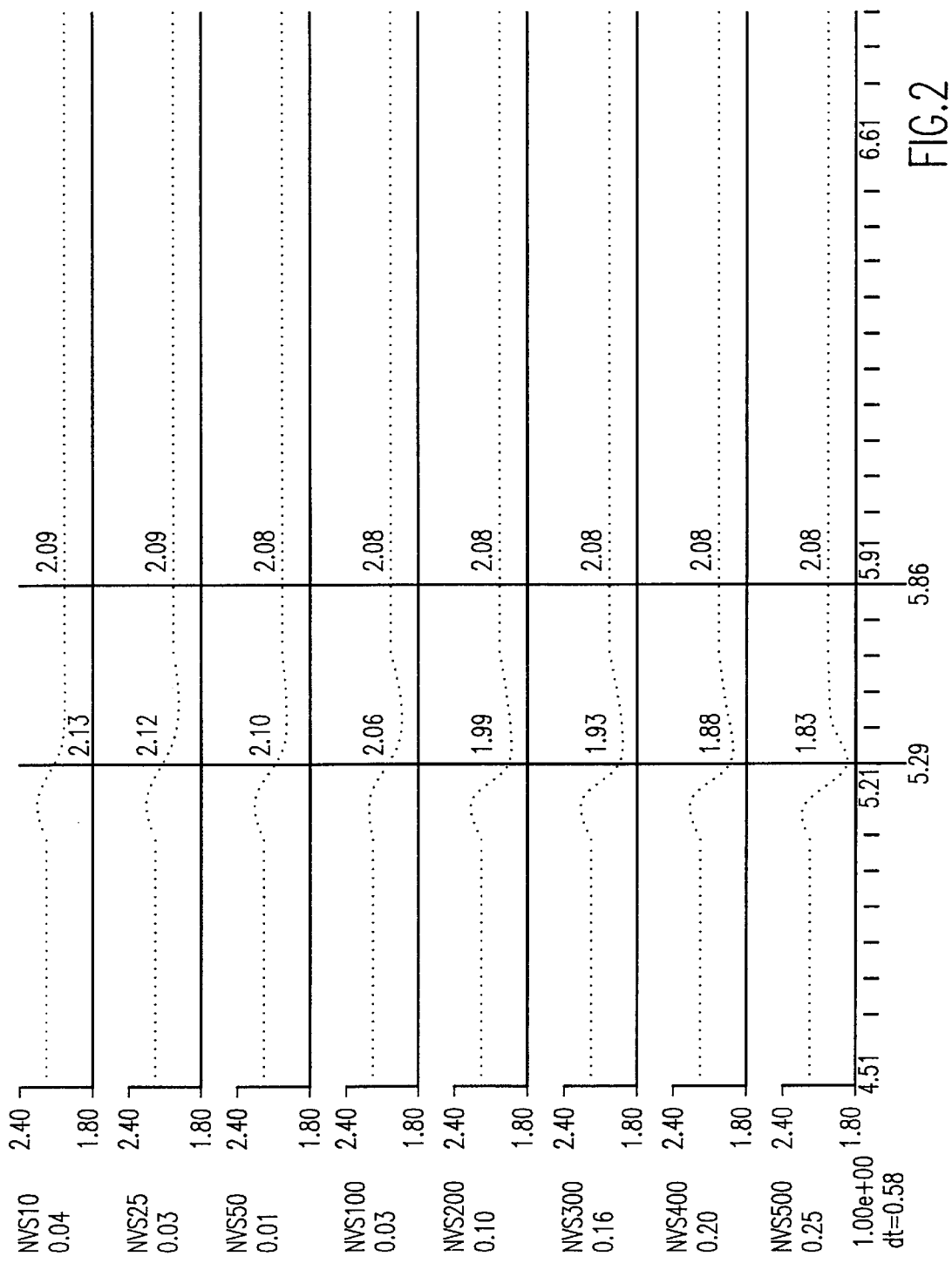
FIG. 2 is a timing diagram showing the variation in power supply voltage with the time constant of the decoupling capacitance.

The drop in the supply voltage at node 14 for decoupling time constants of 10 picoseconds (ps) to 500 ps is shown in FIG. 2 for inverter switching delays typical of 0.25 micron effective channel length transistors. As shown in the waveforms for decoupling capacitor time constants greater than a few hundred picoseconds, there is a substantial dip in the inverter power supply voltage. Therefore, the time constant of an on-chip decoupling capacitor should be in the range of 200 ps to 300 ps or faster to minimize the voltage drop of the internal power supply voltage during switching. Obviously, as the technology is scaled to smaller geometries, the decoupling capacitor time constants will also have to be reduced.

Trench decoupling capacitors could be formed by using an array of trenches identical to those in a dynamic random access memory (DRAM) array, without any change in configuration and contacting schemes. However, the disadvantage of such structures is the large series resistance to the inner and outer plates of the capacitor.

The structure of the present invention modifies the layout and contacting scheme to optimize the capacitance per unit area versus RC time constant.

Figure 3:
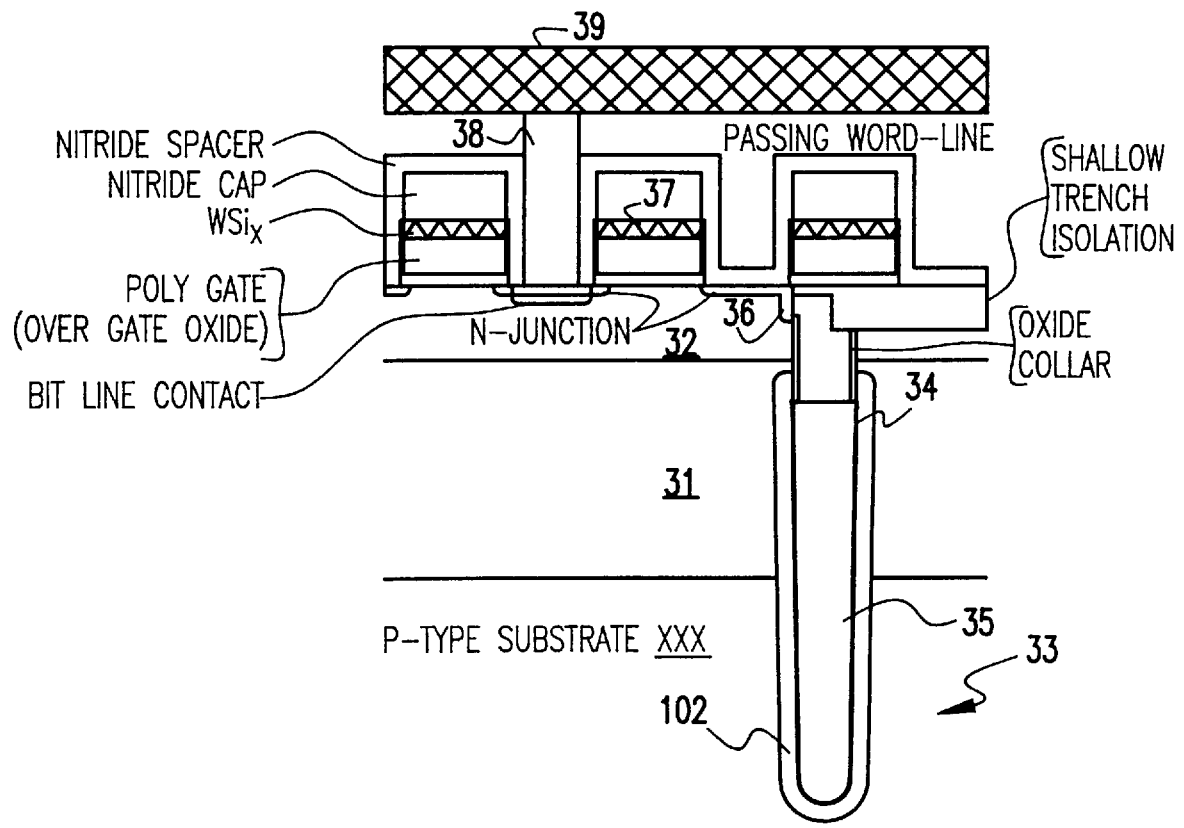
FIG. 3 is a cross-sectional view of the structure of a dynamic random access memory (DRAM) capacitor cell.

A current 256 megabit (Mb) DRAM trench capacitor cell is shown in cross-section in FIG. 3. The p-well 32 is separated from the p-type substrate by a buried n-well 31. The purpose of the buried n-well is to ensure connectivity between out diffused n+ regions around the trenches. The trench capacitor is formed in a trench shown at 33. The trench extends through the buried n-well 31 and is lined with a dielectric 34, such as oxidized nitride (ON). The trench is filled with polysilicon 35, that forms the first cell capacitor plate, while the out diffused n+ regions connected by the buried n-well 31 constitute the second capacitor plate common to all cells in the sub-array. The trench polysilicon capacitor plate is connected at the top by a buried strap 36 to an n-junction of a MOSFET that acts as a transfer device with the gate connected to word line 37. A doped polysilicon stud 38 makes the connection between a bit line contact common to two cells and the tungsten bit line 39.

Figure 4:
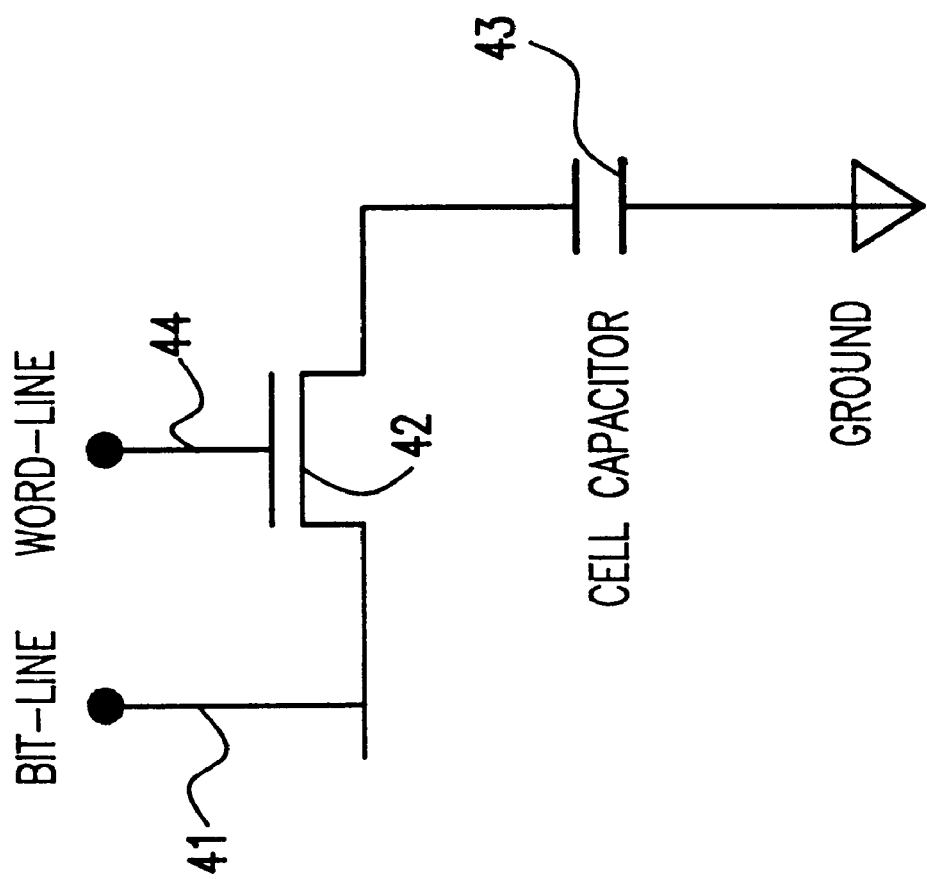
FIG. 4 is a schematic diagram of the equivalent circuit of the DRAM capacitor cell structure shown in FIG. 3.

The equivalent circuit is shown in FIG. 4 and comprises a bit line 41, an FET transfer device 42, and a cell capacitor 43. The word line 44 is connected to the gate of the FET transfer device 42.

The main features of this cell, as shown in FIG. 3, are the polysilicon fill 35 that forms the inner plate, the strap 36 that constitutes the connection between inner plate and transfer device, and the polysilicon stud 38 that constitutes the connection to the bit-line 39. The outer plate is formed by a heavily doped n+ region 102 that out diffuses from each trench and surrounds it. While the heavily doped regions 102 may merge into each other under certain conditions, a lighter doped n-channel "buried plate" 31 is implanted deep in the silicon substrate to ensure continuity of the outer plate under all conditions.

When used for decoupling capacitors, this structure exhibits a series resistance in the range of twenty-five kilo Ohms (K$\Omega$), and hence a time constant in the range of one nanosecond (ns). Without modifications, the structure is therefore unsuitable for decoupling capacitors.

Figure 5:
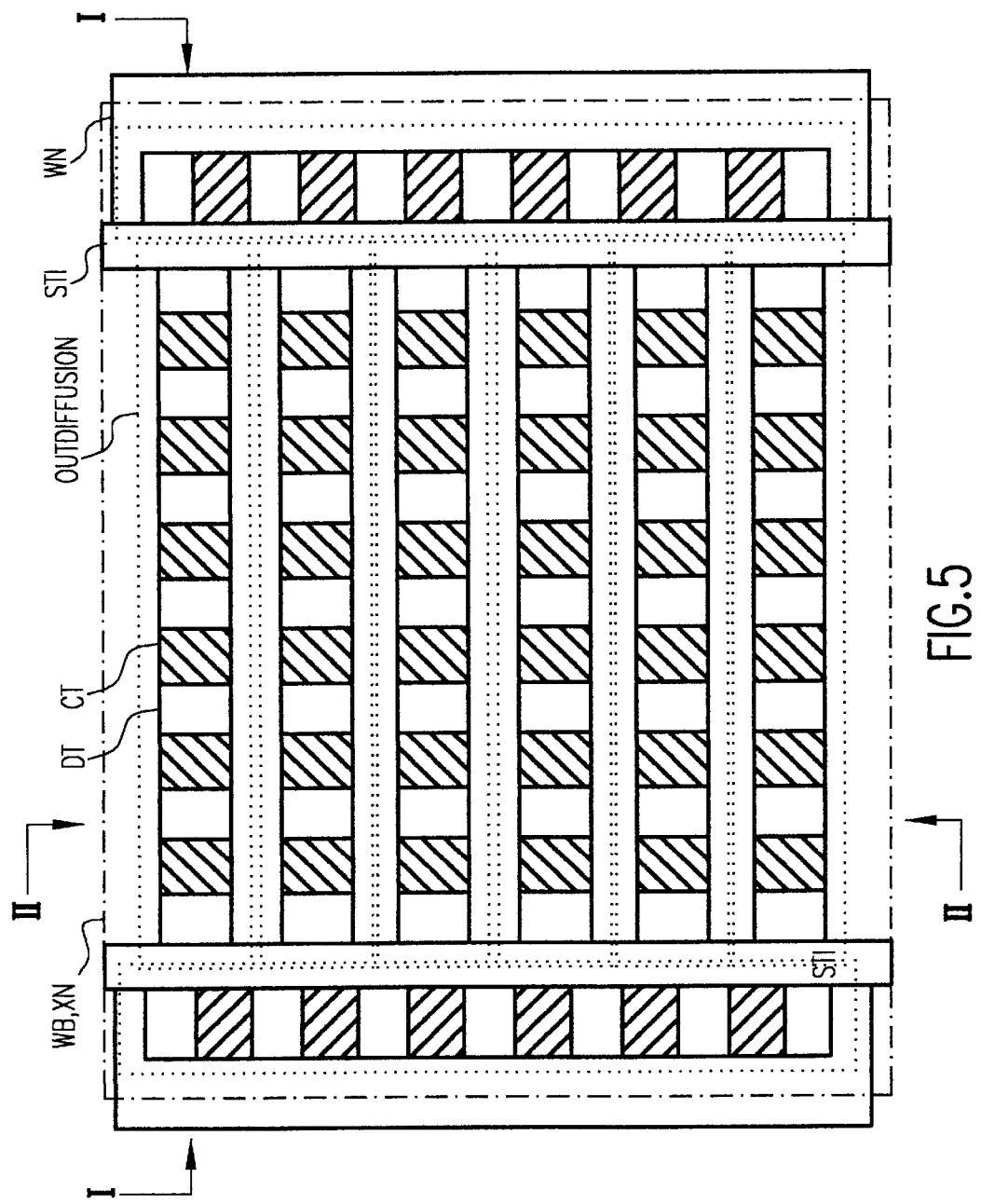
FIG. 5 is a top view of the decoupling capacitor wit linear trenches according to the present invention.
Figure 6A:
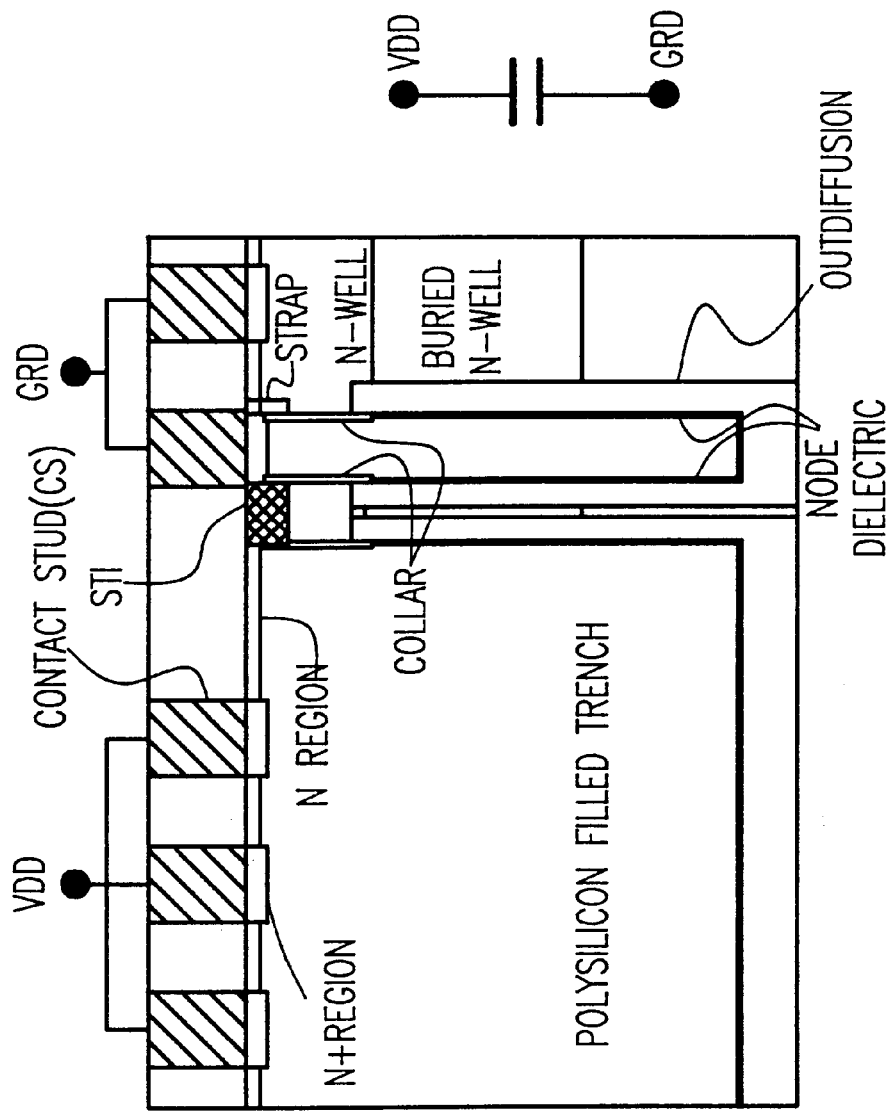
FIGS. 6A and 6B are horizontal and vertical cross-sections, respectively, of the decoupling capacitor shown in FIG. 5 according to the present invention.
Figure 6B:
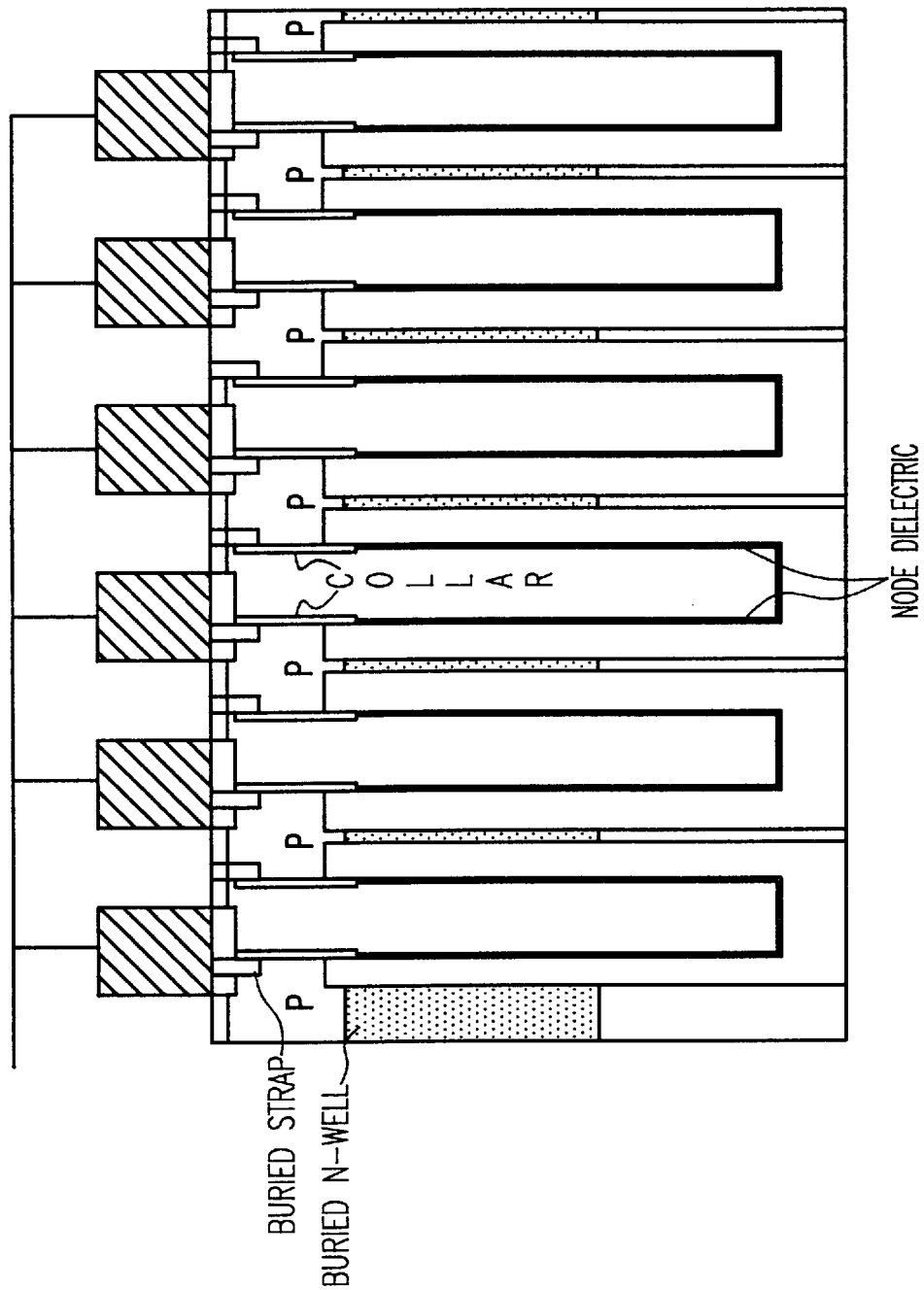

A top view and corresponding cross-sections of the preferred decoupling capacitor structure according to the present invention are shown in FIGS. 5, 6A and 6B. The array of linear trenches, as best seen in FIG. 5, is designed to reduce the series resistance of the polysilicon inner plate with respect to that of an array of individual DRAM trench capacitors having an equivalent total capacitance. The inner plates are connected by the top n+ film formed during the definition of peripheral source/drain and contacts. Contacts to the top plate are made with peripheral tungsten studs, rather than polysilicon studs as used in the DRAM array. While a buried strap is formed around the top periphery of the trench, it is not substantial in determining the current path to the buried plate, as shown in FIGS. 6A and 6B. The ground rule on contact to contact space determines the trench to trench separation. The dotted line labeled as out-diffusion shows the contour of the out-diffused n+ regions around trenches. The trench separation does not guarantee that the out diffusions will merge into each other. Therefore, a buried n-well (denoted as WB) is necessary to ensure that all out diffused regions are connected to form the common capacitor plate. The boundary marked as XN defines heavily doped n+ contact regions (same used in DRAM peripherals). This will become more clear in the cross-sections of FIGS. 6A and 6B. The array of linear trenches is separated by shallow trench isolation (STI) regions from trench/well contacts to the buried plate, on the far left and right of the structure.

FIG. 6A is a cross-section in the X—X direction along a portion of one linear trench. The metal studs connected on the left (labeled as VDD in this example) constitute contacts to the inside trench capacitor plate. The top n and n+ regions within the linear array of trenches merge into the n+ polysilicon inside the trench. Since no shallow trench isolation (STI) is formed within the top capacitor area, full contact is made to the inside plate of each trench, so that the total resistance to the inner plate is only limited by the inner polysilicon resistance. This resistance is reduced considerably by deleting the STI from the top trench region. Another minor factor is the fast diffusion of source/drain dopants through polysilicon.

FIG. 6B is a cross-section normal to the linear trench array. The ground rule on contact to contact spacing determines the trench to trench separation. Since it is not guaranteed that the trench out diffusions merge, the buried well is needed to ensure continuity. The p-regions separate the top n+ contact to the inside trench plate from the common outside plate (out-diffusions). The p-regions are all interconnected to a common contact (not shown).

Figure 7:
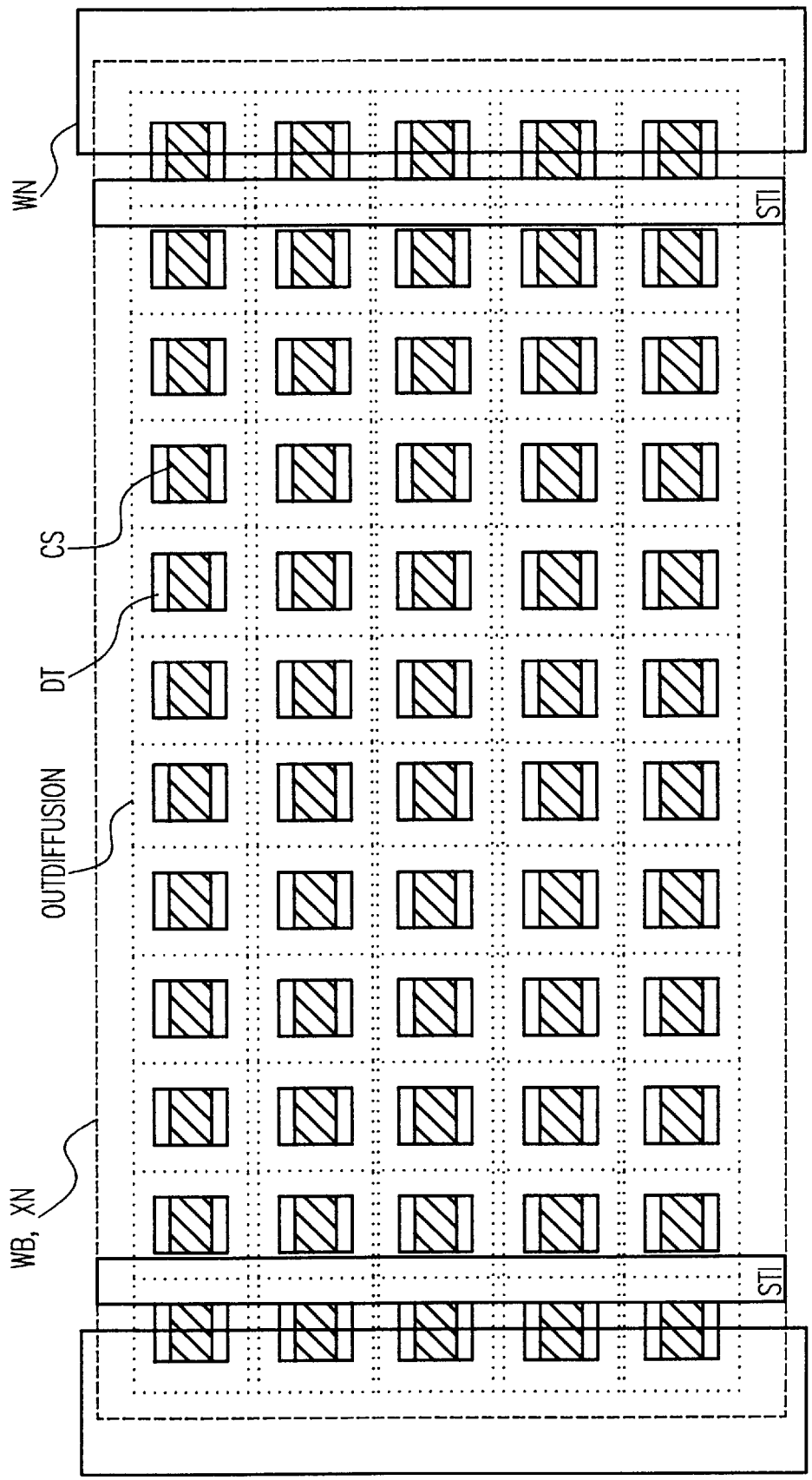
FIG. 7 is a top view showing an alternative structure of the decoupling capacitor of FIG. 5 in which the linear trenches are segmented.

Although the array of linear trenches is the preferred embodiment, it is possible to segment the linear trench, as shown in FIG. 7, into a series of individual trenches with no changes to the processing sequence.

The second part of this aspect of the invention is related to the outer plate connection. This is made by a combination of n-well, peripheral NMOS source/drain and contacts, and second trench on each side of the capacitor, referred to here as contacting trench and shown in FIGS. 5 and 6A. The contacting trench is placed at the vicinity of the capacitor trench array so that the out diffused n+ regions around the trenches merge. In the case of process changes where merger is not "guaranteed", the implanted "buried plate" ensures continuity, however, without appreciably increasing the series resistance. The outer plate resistance is now dominated by the "down" resistance through the n-well to the contacting trench, as shown in FIG. 6A. Merger of linear trenches within the capacitor is not required because the current path from contacting trench to the outer plate of capacitor trenches is determined by the out-diffused region parallel to each linear trench.

The basic trench capacitor structure described above can also be used in a static random access memory (SRAM) cell. The combination of the high trench capacitance and the shielding provided by the buried n-well as generally shown in FIGS. 6A and 6B can be used to minimize voltage disturbances in the SRAM cell from soft errors due to alpha particles and cosmic rays incident on the silicon substrate.

Figure 8:
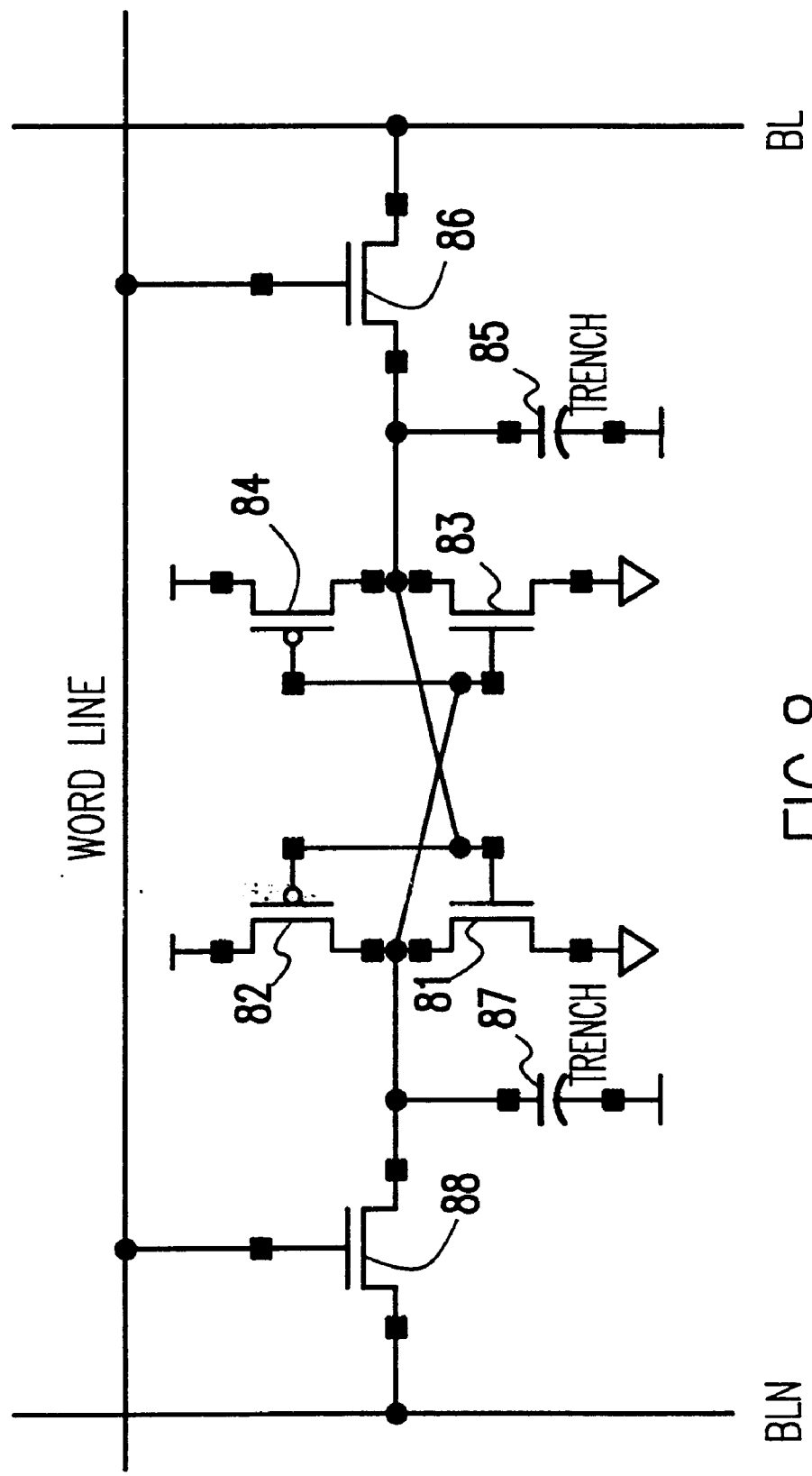
FIG. 8 is a schematic diagram showing a static random access memory (SRAM) cell.

The circuit schematic of a six transistor (6T) CMOS static random access memory (SRAM) cell is shown in FIG. 8. The cell is comprised of a pair of cross-coupled invertors. One inverter is constituted by n-channel FET device 81 and p-channel FET device 82 having their drains connected in common. The other inverter is constituted by n-channel FET device 83 and p-type FET device 84 having their drains connected in common. The drains of devices 81 and 82 are connected to the gates of devices 83 and 84, and the drains of devices 83 and 84 are connected to the gates of devices 81 and 82, forming a well known cross-coupled latch. Information is stored in the cross-coupled latch which is interconnected with the output A connected to the gates of devices 81 and 82 and the output B connected to the gates of devices 83 and 84. As a result of the cross coupling, with the back-to-back invertors, stable states occur with either node A high and node B low or node A low and node B high. Node A is connected to a first trench capacitor 85 and via an access transistor, formed by n-channel FET device 86, to a bit line BL. Similarly, node B is connected to a second trench capacitor 87 and via an access transistor, formed by n-channel FET device 88, to a bit line not BLN or $\overline{BL}$. The gates of devices 86 and 88 are connected to a word line.

To read the information stored in the cell, the bit line (BL) and bit line not (BLN or $\overline{BL}$) are precharged to a high level and then the word line is driven high for the selected cells. As shown, the gates of n-channel access transistors are connected to the word line. The access transistor connected to the latch node that is in a low state will turn on and begin to discharge its respective bit line indicating a low state on that side of the latch. Turn-on occurs when the word line voltage is greater than the threshold voltage of the access transistor. The other access transistor will not turn on because even though its gate voltage goes high, both its drain and source are at a high potential and the gate-to-source (or drain) voltage never reaches the device threshold voltage.

During a write, one of the bit lines is driven low and the other high. Assume the cell has the opposite state stored in it from the bit line voltages. For this case, both access transistors will turn on and the high cell node will discharge and the low cell node will be charged high. The access transistors must be sufficiently strong to overcome the current of the p-channel device on the high side of the latch so the node can discharge to a low voltage. Conversely, during a read, the access transistor connected to the low side of the latch must not be too strong or it will upset the information stored in the cell. Therefore, in designing the cell, the ratios of the transistors must be chosen carefully to ensure a window exists for stable cell operation under device parameter and voltage variations.

Soft errors due to alpha particles or cosmic rays are also a concern in the design of 6T CMOS SRAM cells. These particles cause very fast voltage spikes to occur on the diffused junctions of the transistors. In 6T CMOS SRAM cells, if the resulting disturbance is large enough, the cell can switch state and information will be lost. Obviously, whether or not a noise disturbance causes a cell to switch state is directly related to the amount of stored charge and the node voltage.

The trend in SRAM cells, and very large scale integrated (VLSI) circuit technology in general, is exemplified by lithographic scaling to achieve greater density. This results in dense SRAM cells with lower node capacitance and reduced supply voltages which cause the cells to be more susceptible to voltage disturbances caused by alpha particles and cosmic radiation.

Figure 9:
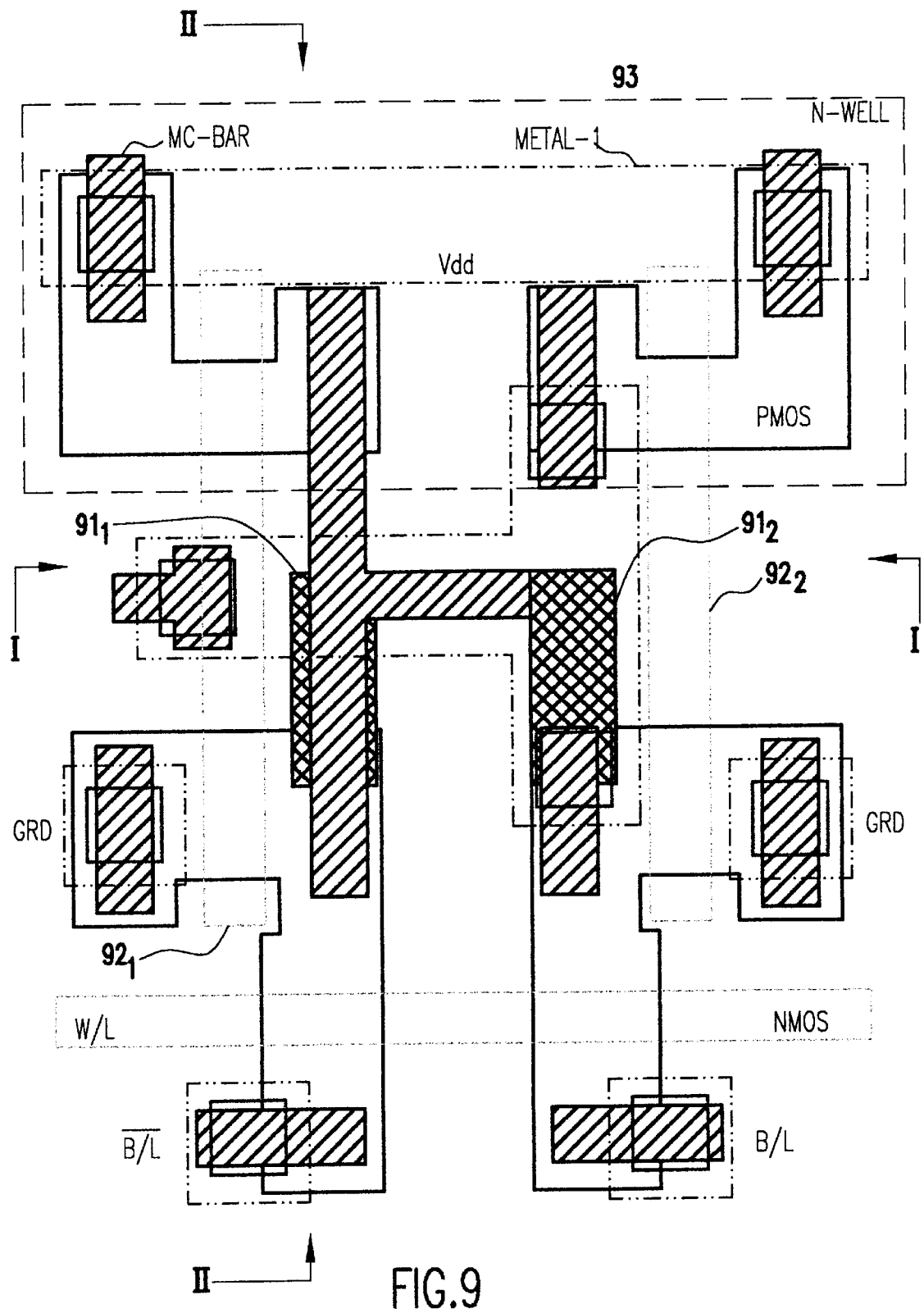
FIG. 9 is a top view showing the structure of the SRAM cell of FIG. 8.
Figure 10:
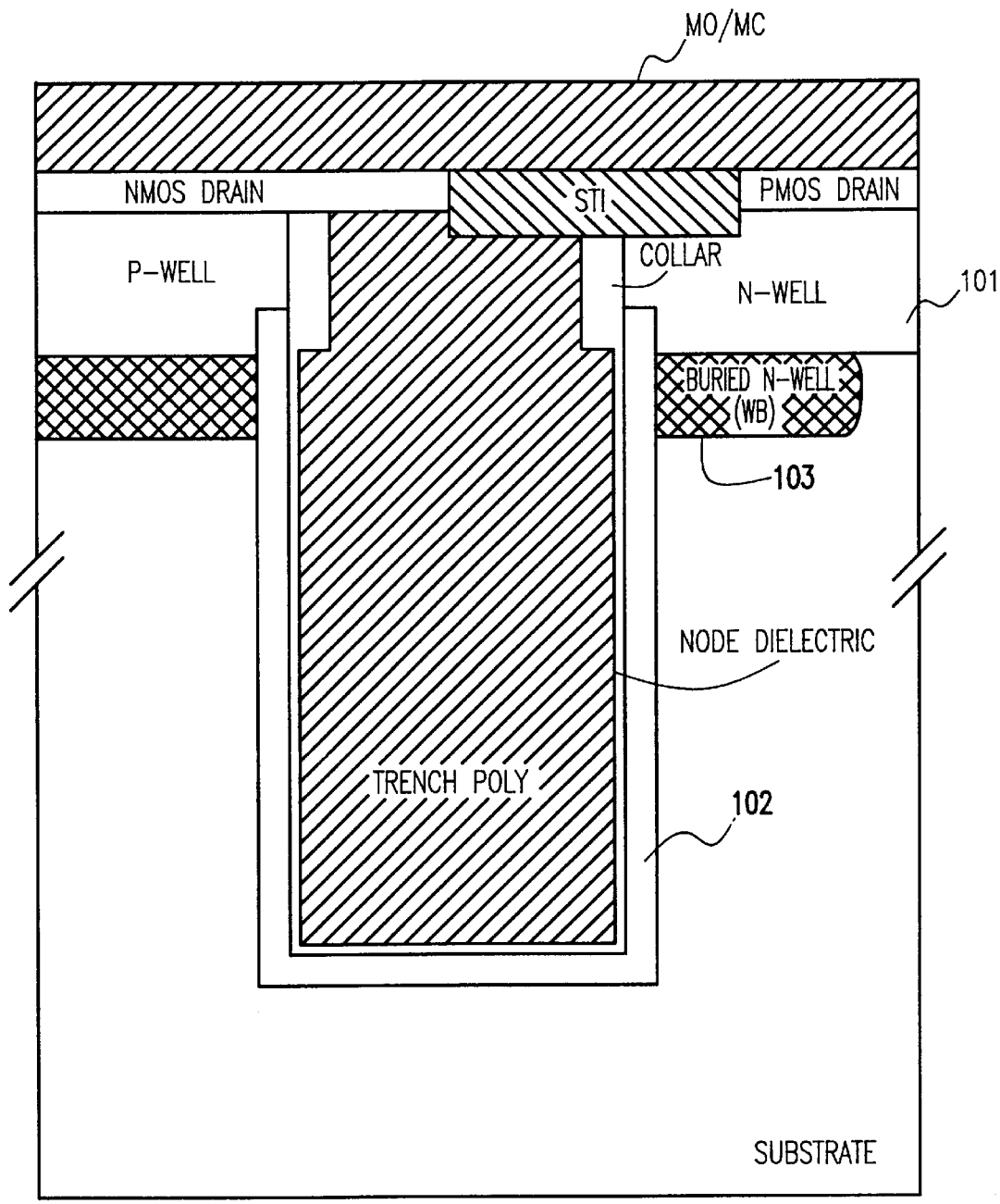
FIG. 10 is a cross-section along Y—Y in the Y-direction through the left trench of the SRAM cell shown in FIG. 9.
Figure 11:
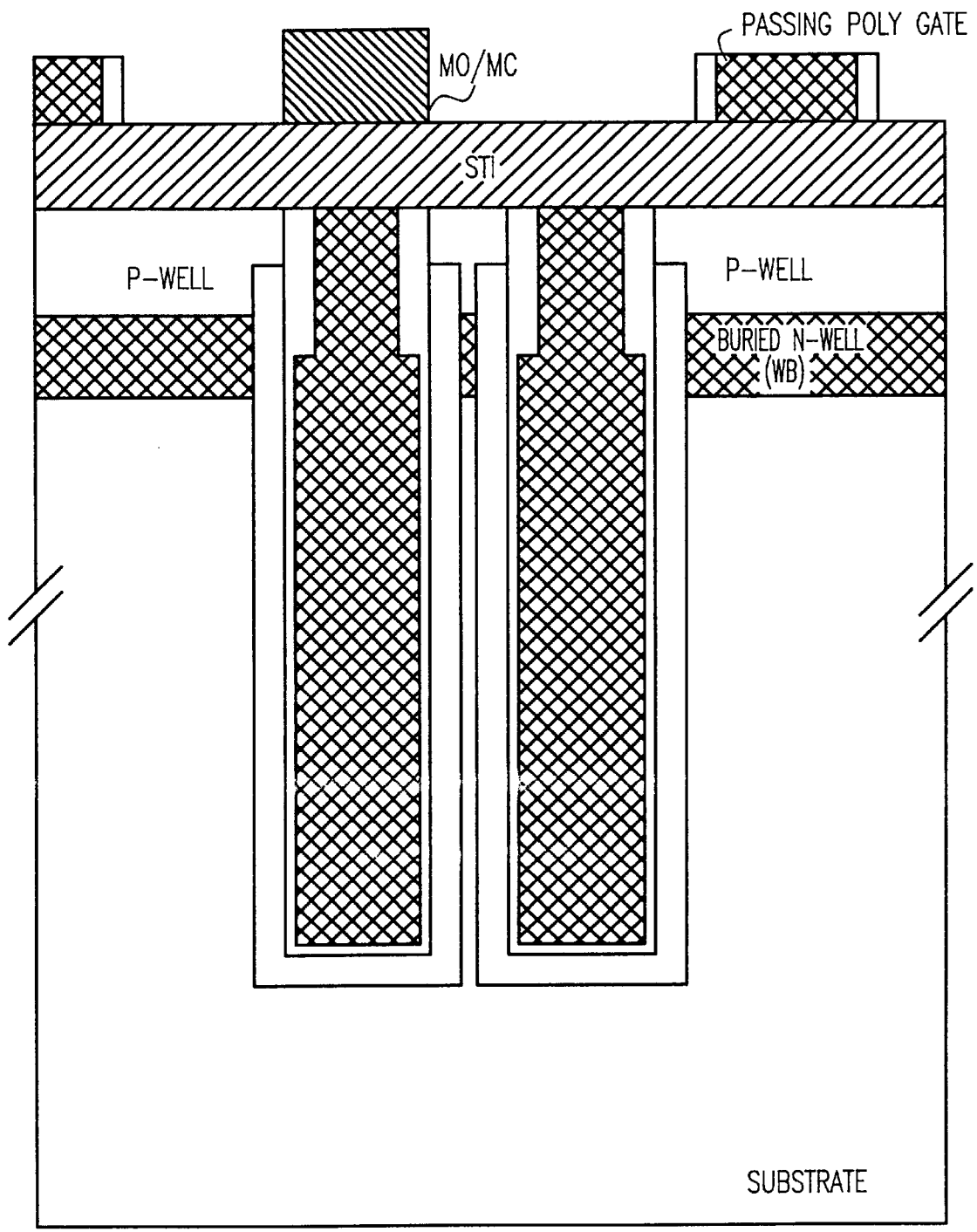
FIG. 11 is a cross-section along X—X in the X-direction through both trenches of the SRAM cell on the p-well side in FIG. 9.

In the SRAM cell according to the present invention, the combination of a high capacitance trench and buried shield achieve orders of a magnitude more immunity to soft errors than a standard 6T CMOS SRAM cell of comparable density. Since the trenches and shield are buried beneath the SRAM cell, there are no special requirements on cell layout except that the inner plates of the trenches contact the nodes of the cross-coupled latch and the outer plates of the trenches be connected either to the power supply or ground. This is seen in FIG. 9 where the two trenches $91_1$ and $91_2$ have been superimposed on a conventional 6T CMOS SRAM cell. For the example shown, the inner plates of the trenches are connected to the nodes (i.e., gates $92_1$ and $92_2$) of the latch and the outer plates are connected to the n-well 93 of the cell which is connected to the power supply. This can be seen in the simplified cross-section of the trench capacitor and buried shield shown in FIG. 10. The outer plate of the capacitor can be connected either directly to the n-well 101 by the out diffused n+ region 102 surrounding the trench or from this out diffused n+ region 102 through the buried n-well (WB) 103 to the n-well 101.

Placing the buried n-well (WB) 103 beneath the diffused nodes of the latch forms a shield or barrier that helps to reduce the amount of charge collected from an alpha particle or cosmic ray disturbance. When an alpha particle is incident upon silicon, it creates electron-hole pairs. The electron-hole pairs form a cylindrical column on the order of twenty-five microns long. If the alpha particle penetrates a depletion region, a funnel is created and carriers in the track will be collected by the junction causing a very fast voltage disturbance on the node. Nodes adjacent to the track can collect minority carriers that diffuse toward the junctions. Intersecting the cylindrical column of electron-hole pairs with the buried n-well 103 significantly reduces the amount of charge collected at the junction. This reduction in charge combined with the additional charge from the trench capacitor results in a cell with high immunity to disturbances caused by alpha particles, or cosmic rays.

The preferred embodiment of the 6T CMOS SRAM cell combines a trench capacitor and buried n-well shield for greater immunity to alpha particles. It includes the outer plate 102 of the trench connected to the buried n-well (WB) 103 which in turn is connected to the power supply through the n-well 101. There are several alternatives to this preferred embodiment which are possible. First, the buried shield can be omitted and a connection directly made to the n-well 101 from the n+ out diffused region 102 surrounding the trench. The disadvantage of leaving out the buried n-well (WB) 103 is the elimination of the buried shield and the corresponding reduced immunity to disturbances. Another alternative is to connect the outer plate of the trench capacitor to the buried n-well which would be connected to ground in a similar manner to what is described above with respect to the first aspect of the invention. This approach retains the advantage of the buried n-well shield 103 at the expense of additional ground contacts as described with reference to the first aspect of the invention plus the layout constraints of having the buried n-well at ground potential and the surface n-well at Vdd.

Another advantage of the preferred embodiment of the invention is the additional decoupling capacitance that the SRAM array provides. In high performance circuits, decoupling capacitance is needed to minimize the noise on the power supply and ground busses during switching transients. For 64 Kb array, the trench capacitor in the CMOS SRAM array provides more than twenty-five nano Farads (nF) of additional decoupling capacitance. There is no area penalty for this capacitance since the trenches are located under the junctions of the cell.

Performance is a potential concern for the invention. Adding a trench capacitor to the cross-coupled nodes of the latch greatly increases the capacitive loading. During a read, the added capacitance will tend to make the cell more stable and will not change the read access. However, during a write, it will take longer to switch the state of the cell because of the large capacitance that must be discharged and charged. Estimates for a 64 Mb/256 Mb process are in the one nanosecond range to switch the cell state during a write. This requirement will have to be included in the circuit operation to make sure the wordline pulse width is sufficient during a write for the cell to change state under worst case parameter variations.

While the invention has been described in terms of preferred embodiments, those skilled in the art will recognize that the invention can be practiced with modification within the spirit and scope of the appended claims.

Having thus described our invention, what we claim as new and desire to secure by Letters Patent is as follows:

1. A method of making a decoupling capacitor in a silicon semiconductor substrate for decoupling an integrated circuit comprising the steps of:

forming a plurality of trenches in a substrate in close proximity to each other;

forming a dielectric film on an inner surface of each said trench;

out-diffusing an n-type dopant from said inner surface to form an outer plate at each said trench, said out-diffusion from each said trench diffusing to or into out-diffusions from adjacent said trenches, said out-diffusions providing a low resistance path to ground;

filling the plurality of trenches with polysilicon to form an inner plate in each said trench;

forming a surface n+ film on the substrate during definition of peripheral source/drain contacts of the integrated circuit, said n+ film connected to each said inner plate; and forming a metal contact to each said inner plate.

2. A method of making a decoupling capacitor in a silicon semiconductor substrate for decoupling an integrated circuit comprising the steps of:

forming a plurality of trenches in a substrate in close proximity to each other;

forming a dielectric film on an inner surface of each said trench;

out-diffusing an n-type dopant from said inner surface to form an outer plate at each said trench, said out-diffusion from each said trench diffusing to or into out-diffusions from adjacent said trenches, said out-diffusions providing a low resistance path to ground;

filling the plurality of trenches with polysilicon to form an inner place in each said trench;

forming a surface n+ film on the substrate during definition of peripheral source/drain contacts of the integrated circuit said n+ film connected to each said inner plate;

forming a metal contact to each said inner plate; and connecting an outer plate to an inner plate at one or more of said plurality of trenches to form a connecting trench.

3. The method of claim 1 further comprising, before the step of forming the trenches, the step of:

forming a buried n-well in the substrate, the trenches extending through the buried n-well layer, the buried n-well connecting together any out-diffusions having spaces to adjacent out-diffusions.

* * * * *